(12) United States Patent
Argast et al.

(10) Patent No.: US 7,476,848 B2
(45) Date of Patent: Jan. 13, 2009

(54) OPTICAL SENSOR EMPLOYING AN INJECTION-MOLDED CASING

(75) Inventors: Martin Argast, Hülben (DE); Günther Schwartz, Weilheim/Teck (DE); Thomas Dümmel, Hülben (DE); Gernot Mast, Weilheim/Teck (DE)

(73) Assignee: Leuze Electronic GmbH & Co. KG, Owen/Teck (DE)

( * ) Notice: Subject to any disclaimer, the term of this patent is extended or adjusted under 35 U.S.C. 154(b) by 0 days.

(21) Appl. No.: 11/077,492

(22) Filed: Mar. 11, 2005

(65) Prior Publication Data

US 2005/0199792 A1 Sep. 15, 2005

(30) Foreign Application Priority Data

Mar. 11, 2004 (DE) .................. 10 2004 011 804
Jan. 26, 2005 (DE) .................. 10 2005 003 619

(51) Int. Cl.
*H01J 5/02* (2006.01)
*G06M 7/00* (2006.01)

(52) U.S. Cl. ...................... 250/239; 250/221

(58) Field of Classification Search ............... 250/239, 250/208.1, 226, 221; 257/678, 680, 687, 257/701, 702, 706, 723; 438/64–66
See application file for complete search history.

(56) References Cited

U.S. PATENT DOCUMENTS

| | | | |
|---|---|---|---|
| 4,354,106 A | 10/1982 | Walter | |
| 4,652,750 A * | 3/1987 | Eastman et al. | 235/462.45 |
| 4,967,081 A * | 10/1990 | Quad et al. | 250/338.1 |
| 5,233,178 A * | 8/1993 | Tokunaga | 250/208.1 |
| 5,340,330 A * | 8/1994 | Dolson et al. | 439/447 |
| 5,939,773 A * | 8/1999 | Jiang et al. | 257/666 |
| 5,990,475 A * | 11/1999 | Alegi | 250/239 |
| 6,064,002 A * | 5/2000 | Hayami et al. | 174/52.1 |
| 6,411,403 B1 * | 6/2002 | Siddhamalli | 385/109 |
| 6,507,015 B1 * | 1/2003 | Maeno et al. | 250/227.25 |
| 2003/0173707 A1 * | 9/2003 | Becker et al. | 264/272.11 |

FOREIGN PATENT DOCUMENTS

| | | |
|---|---|---|
| DE | 41 26 909 C2 | 2/1993 |
| DE | 698 05 517 T2 | 1/2003 |
| DE | 10 2004 011 804 A1 | 10/2005 |
| GB | 2 156 292 * | 10/1985 |
| GB | 2 381 752 A | 5/2003 |
| WO | WO 00/26654 A2 | 5/2000 |

OTHER PUBLICATIONS

German Office Action dated Jun. 30, 2006 from DE 10 2005 003 619.8-52, plus translation.
Office Action from Chinese Patent Application No. 200510054743.8.

* cited by examiner

*Primary Examiner*—Georgia Y Epps
*Assistant Examiner*—Pascal M Bui-Pho
(74) *Attorney, Agent, or Firm*—Robert Kinberg; Steven J. Schwarz; Venable LLP

(57) ABSTRACT

An optical sensor for detecting objects within an area to be monitored comprises at least one casing to accommodate optical and electronic components. The at least one casing comprises casing parts. The casing parts are composed of a low-pressure injection molding compound and are formed by a low-pressure injection molding operation.

6 Claims, 6 Drawing Sheets

OPTICAL SENSOR EMPLOYING AN INJECTION-MOLDED CASING

CROSS-REFERENCE TO RELATED APPLICATIONS

The present application claims the priority of German Patent Application No. 10 2005 003 619.8, filed on Jan. 26, 2005, as well as the priority of German Patent Application No. 10 2004 011 804, filed on Mar. 11, 2004, the disclosures of which are incorporated herein by reference.

BACKGROUND OF THE INVENTION

The invention generally relates to an optical sensor for detecting objects within an area to be monitored.

Optical sensors of this type can be embodied as light scanners, light barriers, reflective light barriers, distance measuring sensors and the like. To detect objects in an area to be monitored, the optical sensors comprise optical and electronic components, in particular, a transmitter for emitting light rays and a receiver for receiving light rays. Additional electronic components are provided which are mounted on circuit boards. The components include, in particular, an evaluation unit in the form of a microcontroller or the like in which an object-detection signal is generated at the receiver output. Cables or connectors are typically provided as electrical connecting means which are positioned inside at least one casing with therein-disposed integrated optical and electronic components for the optical sensor.

The casing, or each casing, used for an optical sensor typically comprises a casing body for accommodating the components, wherein this casing body can be closed off with a lid. In addition, exit windows that allow the transmitting light rays and the receiving light rays to pass through are provided in the walls of the optical sensor casing.

The connecting means are integrated into the casing by means of separate joining processes and pressing-in operations, such that they are secured in position. In addition, separate seals must be provided for tightly sealing the joining locations between the casing and the connecting means.

The lid and the exit window or windows must furthermore be secured in casing openings and sealed in, preferably by means of ultrasound welding or gluing. These additional production processes considerably increase the time required for producing the optical sensor and thus lead to an undesirable increase in the production costs. Apart from that, problems occur with sealing means of this type, especially if relatively large areas must be sealed, because irregularities during the application of the sealing means result in leaks which allow humidity or dirt to enter the sensor inside space.

SUMMARY OF THE INVENTION

It is the object of the present invention to provide an optical sensor of the aforementioned type which can be produced economically, and which has improved mechanical characteristics.

The above and other objects may be achieved by means of an inventive optical sensor to detect objects located inside an area to be monitored, comprising: at least one casing to accommodate optical and electronic components, the at least one casing comprising casing parts, wherein the casing parts are composed of a low-pressure injection molding compound and are formed by means of a low-pressure injection molding operation.

The optical sensor according to the invention is used for detecting objects located inside an area to be monitored and comprises at least one casing for accommodating optical and electronic components. Parts of the casing are composed of low-pressure injection molding compound and are respectively formed by means of a low-pressure injection molding operation.

The parts composed of low-pressure injection molding compound can take over different functions and can be produced simultaneously by means of a single low-pressure injection molding operation.

The number of parts required for producing an optical sensor and, at the same time, the production time are considerably lower, which results in a considerable reduction in costs for producing the optical sensor.

Also advantageous is the low melting point for the low-pressure injection molding operations, used to produce parts made from low-pressure injection molding compound. Affixing parts of this type to the sensor casing, which is composed of metal or plastic materials with noticeably higher melting points, can therefore be realized without impairment or damage. Polyamide is particularly suitable as a low-pressure injection molding compound.

The parts made from low-pressure injection molding compound can be attached in various forms to the casing or to other elements connected to the casing and/or can be secured in position thereon. The parts of low-pressure injection molding compound can simultaneously function as position-fixing means and sealing means. The position-fixing and sealing means formed in this way can be produced by means of a low-pressure injection molding operation, thereby considerably reducing the number of parts required for the optical sensor, as well as the time required for assembling the optical sensor.

According to a particularly advantageous embodiment of the invention, the optical sensor according to the invention is provided with a lid for closing off the casing body. The mechanical design of the casing body is such that when fitting the lid onto the casing body, a closed low-pressure injection molding channel is formed which extends in circumferential direction along the joining locations between lid and casing body and additionally extends to the electrical connecting means in the form of a connector or cable. A single low-pressure injection molding operation, with injection molding compound inserted into the low-pressure injection molding channel, is thus sufficient to seal in and secure in position the lid and connecting means on the casing body. A particularly economical and cost-effective production of the optical sensor is thus possible, which furthermore provides a uniform and reliable seal owing to the low-pressure injection molding compound, even for large parts such as lids and the like.

The low-pressure injection molding compound can also meet additional functions, e.g., for guiding light rays. For example, light emitted by a status indicating element can be guided through a low-pressure injection molding channel used as sealing means to a light-exit surface on the outside of the optical sensor casing, without the use of additional structural parts.

Furthermore, parts composed of low-pressure injection molding compound can also be attached to the outside of an optical sensor casing. Examples of this are frames for fixing the position of and seals for the exit windows on the optical sensor.

Finally, the optical sensor casing itself can consist of low-pressure injection molding compound. In that case, the optical and electronic components of the optical sensor form an assembly unit which is completely encased by the injection molding compound in order to form a basic casing body. This variation also permits a particularly cost-effective and economical production of the optical sensor.

BRIEF DESCRIPTION OF THE DRAWINGS

The invention is explained in the following with the aid of the drawings which show in.

DETAILED DESCRIPTION OF THE PREFERRED EMBODIMENTS

Figure 1:
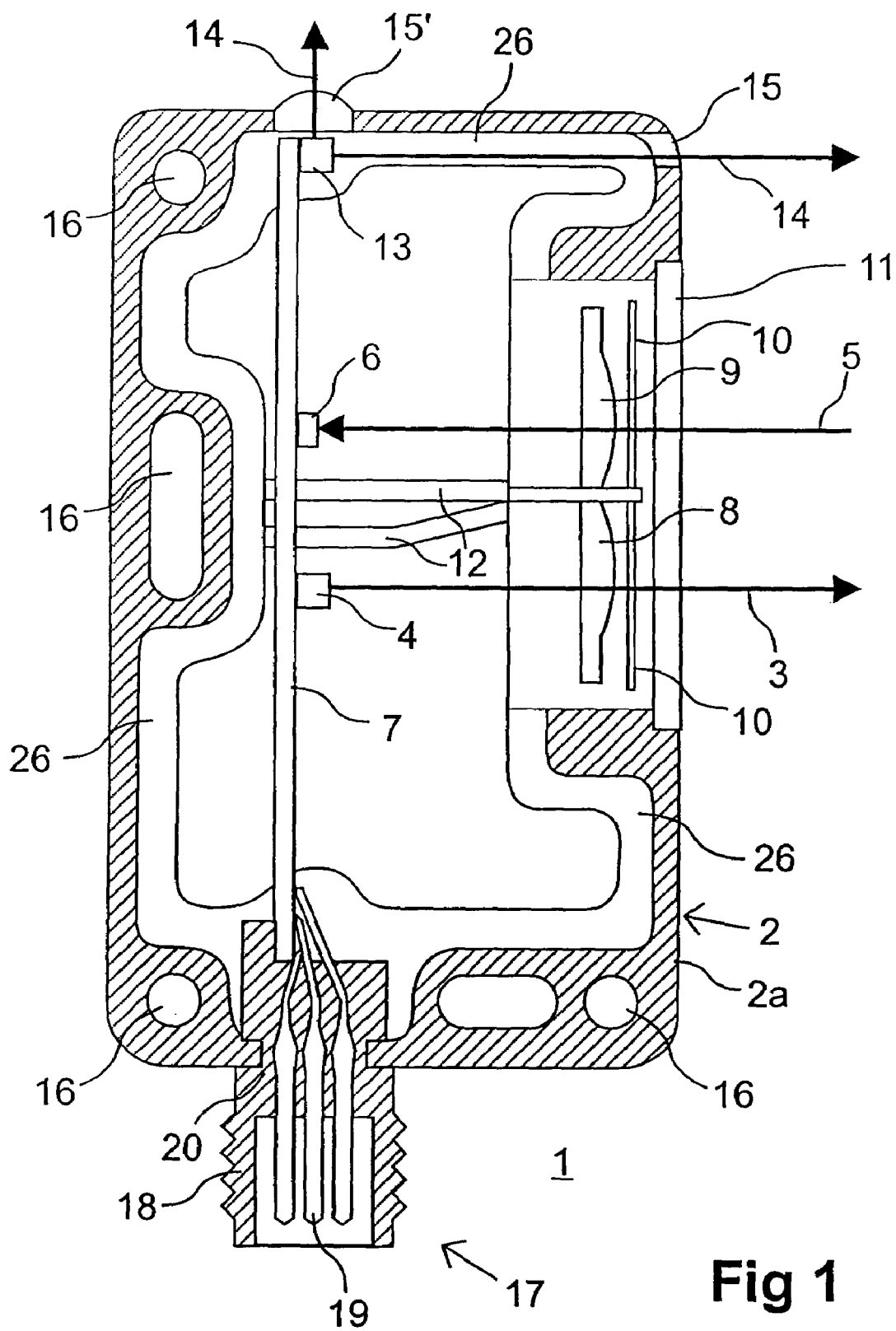
FIG. 1, a longitudinal section through a first embodiment of an optical sensor provided with a connector as connecting means, according to an exemplary embodiment of the invention.

FIG. 1 shows a first exemplary embodiment of an optical sensor 1 for detecting objects in an area to be monitored, wherein the optical sensor 1 herein is embodied as light scanner 7. However, the optical sensor 1 can, in principle, also be embodied as a light barrier, reflection light barrier, distance-measuring sensor or the like.

Figure 3A:
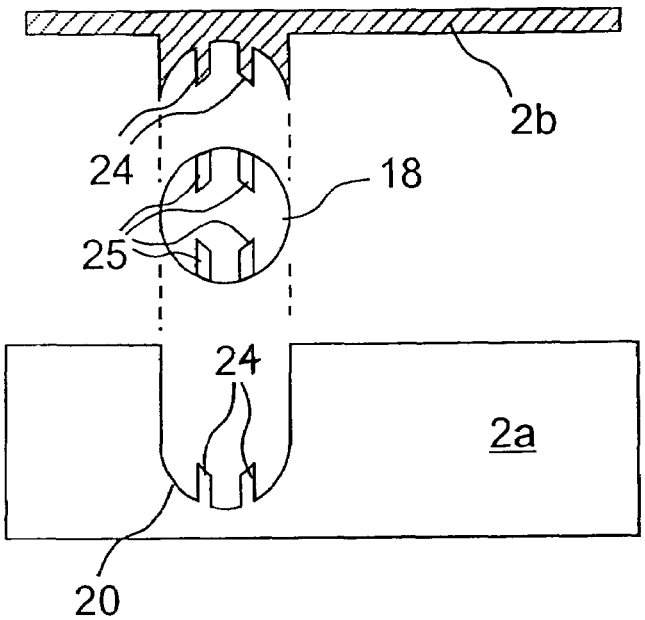
FIGS. 3a and 3b, a view from below of an opening in the casing for the optical sensor according to FIG. 1, showing different installation positions for a connector insert.

The optical sensor 1 is provided with a casing 2 of metal or plastic for accommodating optical and electronic components. FIG. 1 shows the casing body 2a which can be closed off with a lid 2b, wherein the lid is shown in FIGS. 3a,b. For object detection, the optical sensor 1 is provided with a transmitter 4 that emits light rays 3 and a receiver 6 that receives light rays 5. The transmitter 4 is a light-emitting diode or the like, while the receiver 6 is a photodiode or the like. However, multiple arrangements of transmitters 4 and receivers 6 are generally also possible.

The transmitter 4 and the receiver 6 are disposed on a circuit board 7, along with additional electronic components that are not shown herein. These electronic components include, in particular, an evaluation unit in the form of a microcontroller or the like. To generate a binary object detection signal, the evaluation unit evaluates the signals received at the receiver 6. The switching states of the object-detection signal indicate whether or not an object is located inside the area to be monitored.

A transmitting optic 8 is provided for focusing the transmitting light rays 3 into a beam. The receiving light rays 5 are focused with a receiving optic 9 onto the receiver 6. Polarizing filters 10 are installed upstream of the transmitting optic 8 and the receiving optic 9. The transmitting light rays 3 and the receiving light rays 5 are guided through an exit window 11 in the front wall of casing 2.

Crosspieces 12 that extend inside the casing 2 are provided for the optical separation of transmitting light rays 3 and receiving light rays 5.

The status of the optical sensor 1 is indicated by a status indicating element 13 in the form of a light-emitting diode or the like, which is mounted on the circuit board 7. The light rays 14 emitted by the status indicating element 13 can be seen from the outside of casing 2 through the light-exit surfaces 15, 15' in the form of transparent inserts in the casing wall.

Fastening bores 16 which extend through the casing body 2a are provided in the corner regions of casing 2.

A connector 17 forms the electrical connecting means for the optical sensor 1 according to FIG. 1. The connector 17 comprises a connector insert 18 with connector pins 19. The connector pins 19 make contact with contacting regions on the circuit board 7. The connector 17 is positioned inside a casing opening 20 at the lower edge of casing 2.

Figure 2:
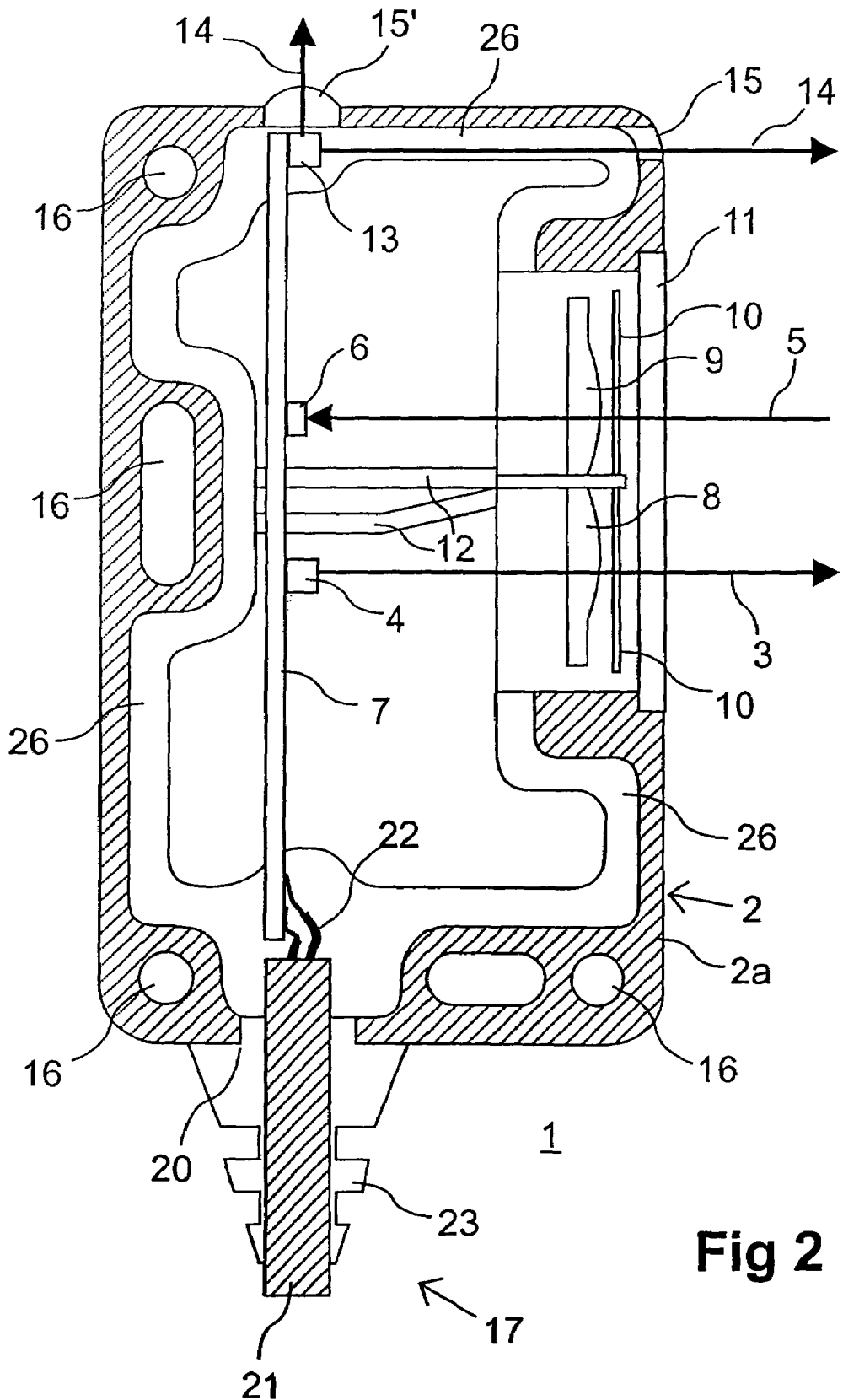
FIG. 2, a longitudinal section through a variant of the optical sensor according to FIG. 1, provided with a cable as connecting means.

The optical sensor 1 according to FIG. 2 corresponds essentially to the optical sensor 1 according to FIG. 1 and differs from this sensor only with respect to the design of the electrical connecting means.

The electrical connecting means for this embodiment is a cable 21 with conductor cores 22 that are connected to the circuit board 7. As shown in FIG. 2, the cable 21 is positioned inside an anti-kinking sleeve 23 which serves as pull relief. The cable 21 with anti-kinking sleeve 23 is disposed inside the casing opening 20 at the lower edge of casing 2.

Figure 3B:
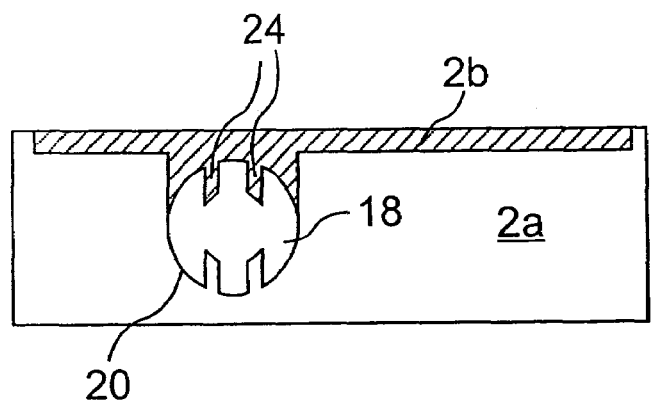

FIGS. 3a and 3b show the lower edge of casing 2 with the casing opening 20 for the optical sensor 1 according to FIG. 1. The casing opening 20 is delimited by sections of the casing body 2a and the lid 2b which can be fitted onto it. Projections 24 project from the casing body 2a and lid 2b section that delimit the edges of the casing opening 20, wherein these projections can be inserted into the recesses 25 of connector insert 18 and position this insert inside the casing opening 20, such that it cannot rotate. In addition, these projections 24 function as a pulling aid for the connector 17. FIG. 3a shows the lid 2b, lifted off the casing body 2a, as well as the connector insert 18 which is inserted into the casing opening 20 of the casing body 2 while FIG. 3b shows the lid 2b fitted on.

Figure 4:
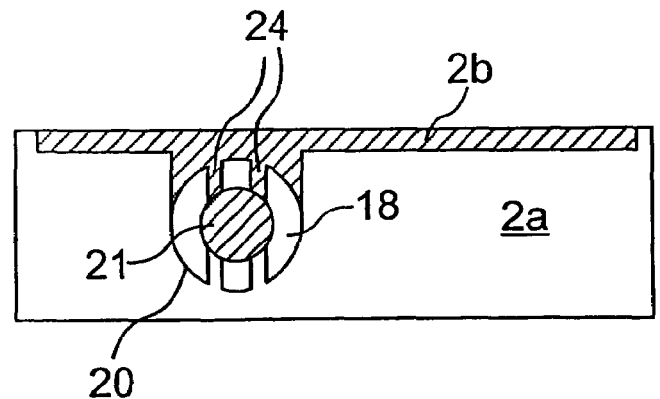
FIG. 4, a view from below of an opening in the casing for an optical sensor according to FIG. 2, with therein disposed cable.

FIG. 4 shows the casing opening 20 for the optical sensor 1 according to FIG. 2, which accommodates the cable 21. The design of casing opening 20 corresponds to that shown in FIGS. 3a and 3b. For this embodiment, the projections 24 on the casing body 2a and the lid 2b function as position-fixation means for the cable 21 and project into the casing opening 20.

FIGS. 1 and 2 show a low-pressure injection molding channel 26, extending circumferentially along the side walls of casing body 2a, wherein this channel can be closed off at the top by fitting on the lid 2b. The low-pressure injection molding channel 26 extends over the backside and the side walls of casing body 2a to the upper and lower edge of casing body 2a. The low-pressure injection molding channel 26 forms a continuous channel that extends to the electrical connecting means. Once the lid 2b is fitted onto the casing body 2a, a low-pressure injection molding compound, preferably polyamide, is pumped into the low-pressure injection molding channel 26 during a low-pressure injection molding operation. Filling the low-pressure injection molding channel 26 with low-pressure injection molding compound establishes a connection between lid 2b and casing body 2a, thus fixing the lid 2b in position and simultaneously sealing the joints between casing body 2a and lid 2b.

Since the electrical connecting means also project into the low-pressure injection molding channel 26, the filling of the low-pressure injection molding channel 26 also results in securing the connecting means in place and sealing in the parts of the connecting means which are positioned in the casing opening 20. For the embodiment according to FIG. 1, the connector insert 18 is secured in position inside the casing opening 20 by means of the low-pressure injection molding compound. With the embodiment according to FIG. 2, the cable 21 is secured in position inside the casing opening 20. In addition, the anti-kinking sleeve 23 also consists of the low-pressure injection molding compound and can be produced during the low-pressure injection molding operation without requiring an additional production step.

Furthermore, the section of the low-pressure injection molding channel 26 that extends along the upper casing edge also functions as guide for guiding the light rays 14, emitted by the status indicating element 13, to the light exit surfaces 15, 15'. The low-pressure injection molding compound is preferably colorless in that case. Alternatively, the low-pressure injection molding compound can have the same color as the casing but is always transparent enough for the light rays 14 to pass through.

Figure 5A:
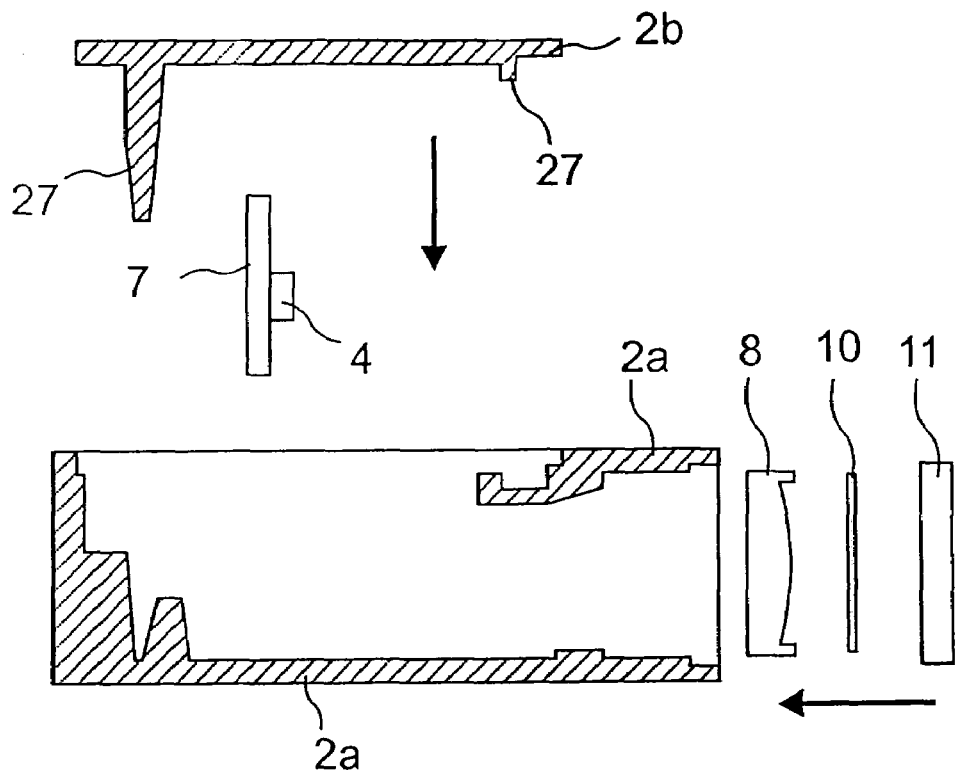
FIGS. 5a and 5b, a cross-section through the optical sensor according to FIGS. 1 and/or 2, showing various assembly positions.
Figure 5B:
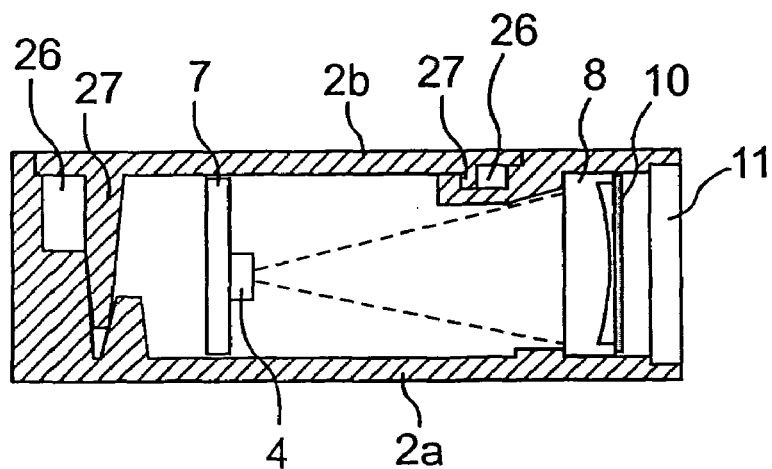

FIGS. 5a and 5b show a first embodiment of the low-pressure injection molding channel 26, wherein FIG. 5a is a view of the individual parts of the optical sensor 1 according to FIGS. 1 and/or 2. FIG. 5b shows the parts in the fully assembled state.

FIGS. 5a and 5b show that the casing body 2a is a molded body into which electronic and optical components of the optical sensor 1 can be inserted. The parts shown in FIGS. 5a and 5b are the circuit board 7 with transmitter 4, the transmitting optic 8, the polarizing filter 10 and the exit window 11.

A projection 27 projects from the lid 2b, extending in circumferential direction along the lid 2b, wherein this projection has a changeable contour that is adapted to the casing body 2a. If the lid 2b is installed on the casing body 2a, then the projection 27 engages in recesses on the casing body 2a, thus forming the low-pressure injection molding channel 26 between these parts, as shown in FIG. 5b.

Figure 6:
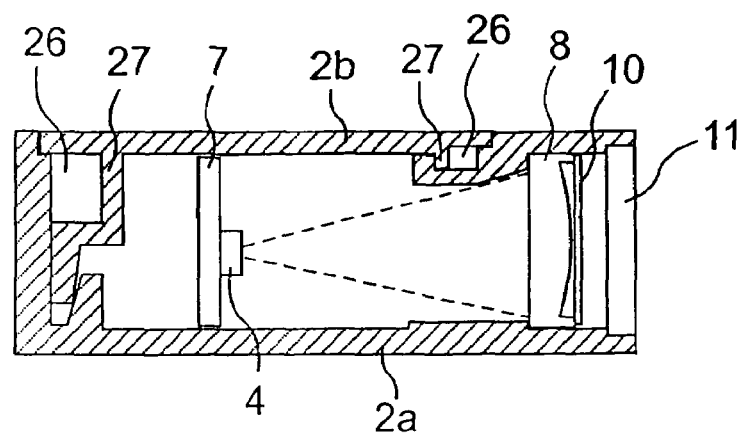
FIG. 6, a cross-section through a variant of the optical sensor according to FIGS. 5a and 5b.

FIG. 6 shows a variant of the embodiment according to FIGS. 5a and 5b. With the variant according to FIG. 6, the projection 27 on the lid is angled twice in the back region of casing 2 in order to form the low-pressure injection molding channel 26. Otherwise, the variant according to FIG. 6 corresponds to the embodiment shown in FIGS. 5a and 5b.

Figure 7:
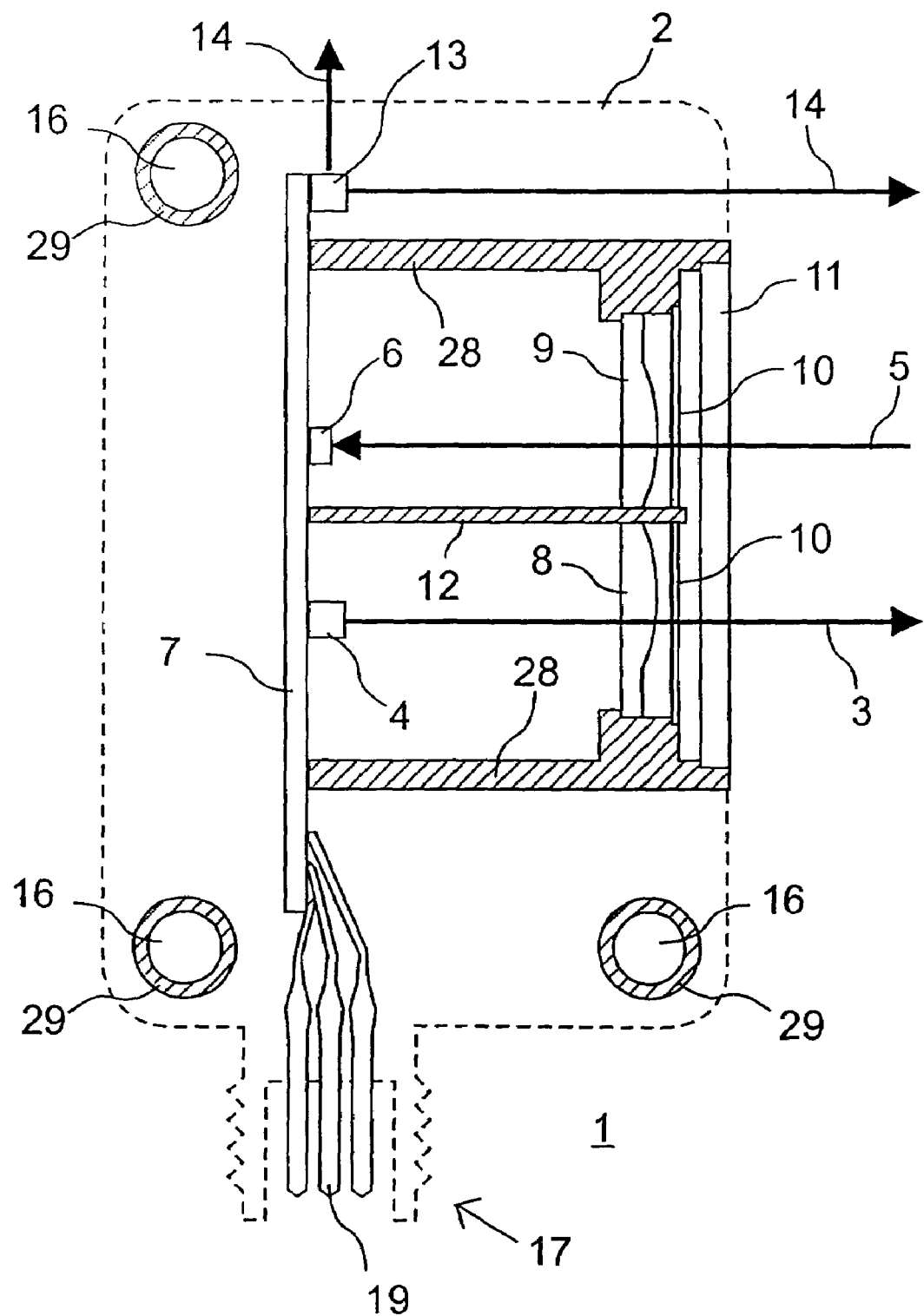
FIG. 7, a longitudinal section through a different exemplary embodiment of the optical sensor.

FIG. 7 shows a different exemplary embodiment of an optical sensor 1. The optical and electronic components correspond to those shown for the embodiment according to FIGS. 1 and 2, but take the form of an assembly unit that is pre-assembled for installation. The optical components of the optical sensor 1 for this embodiment are positioned inside a tube 28 which is disposed on the circuit board 7 and is closed off with the exit window 11. The assembly unit thus forms an encapsulated, sealed unit with the upper and lower edges of the circuit board 7 projecting over the encapsulated unit. The status indicating element 13 is located at the upper, exposed edge of the circuit board 7. The lower, exposed edge of the circuit board 7 is in contact with the connector pins 19 of connector 17, which forms the electrical connecting means for the present embodiment.

The complete casing 2 for the present embodiment is produced from low-pressure injection molding compound. For this, the assembly unit is completely encased with the low-pressure injection molding compound during a low-pressure injection molding operation. The exposed contact locations on the circuit board 7 with connector pins 19 and a portion of the connector insert 18 as well as the status indicating element 13 are encased by the low-pressure injection molding compound and are thus sealed in. In addition, the position of the connector insert 18 is fixed as a result of the encasing operation with low-pressure injection molding compound, wherein the connector 17 can also generally also be composed of low-pressure injection molding compound.

The fastening bores 16 are furthermore formed during the low-pressure injection molding operation. These bores can be reinforced by metal sleeves 29 which are inserted into the injection mold for producing the casing 2.

Figure 8:
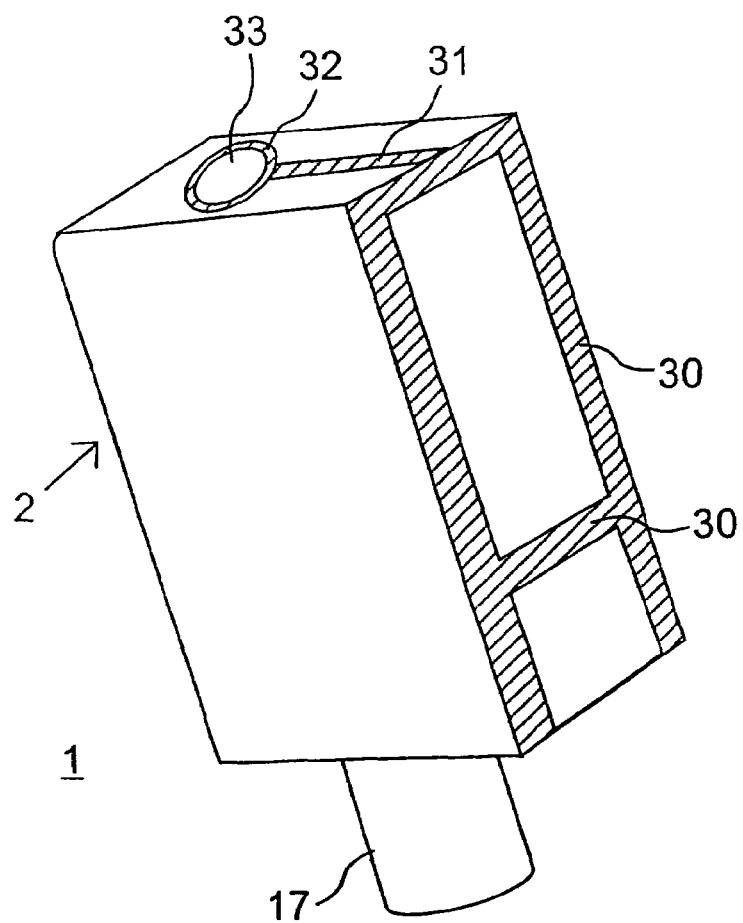
FIG. 8, a perspective representation of a different exemplary embodiment of the optical sensor.

FIG. 8 shows the casing 2 of a different exemplary embodiment of the optical sensor 1. A connector 17 is positioned at the lower casing edge, and an exit window 11 is positioned in the front wall of casing 2, analogous to the embodiment shown in FIG. 1. The exit window 11 for the present embodiment is positioned inside a frame 30 on the outside of the casing 2. The frame 30 is composed of low-pressure injection molding compound and is attached to the outside of casing 2 by means of a low-pressure injection molding operation. The exit window 11 is secured in position and sealed with the aid of frame 30.

An alignment aid 31 in the form of a ridge, consisting of low-pressure injection molding compound, is furthermore affixed to the top of casing 2 during the low-pressure injection molding operation.

Finally, a seal 32 of low-pressure injection molding compound is installed during a low-pressure injection molding operation in order to seal in a transparent display spherical cap 33 that covers an opening in the top of casing 2.

The invention has been described in detail with respect to preferred embodiments, and it will now be apparent from the foregoing to those skilled in the art, that changes and modifications may be made without departing from the invention in its broader aspects, and the invention, therefore, as defined in the appended claims, is intended to cover all such changes and modifications that fall within the true spirit of the invention.

What is claimed is:

1. An optical sensor for detecting objects within an area to be monitored, said sensor comprising:
   optical and electronic components forming a sensor assembly unit;
   at least one casing to accommodate the sensor assembly unit, the at least one casing comprising casing parts, wherein the casing parts comprise a low-pressure injection molding compound and are formed by a low-pressure injection molding operation, wherein at least one of said casing parts comprises a casing body that seals and encases the sensor assembly unit during the low-pressure injection molding operation;
   light-guiding parts comprising low-pressure injection molding compound;
   a light-emitting, status indicating element;
   a light guiding element comprising low-pressure injection molding compound to guide light from the light-emitting, status indicating element to a light exit surface on the outside of the casing; and
   a low-pressure injection molding channel filled with a low-pressure injection molding compound, wherein the low-pressure injection molding channel coupled along an interior surface of said casing and filled with the low-pressure injection molding compound forms the light guiding element.

2. The optical sensor according to claim 1, wherein the low-pressure injection molding compound comprises polyamide.

3. The optical sensor according to claim 1, wherein the sensor further comprises:

a transmitter to emit light rays;

a receiver to receive light rays; and at least one exit window in the casing, wherein transmitted light rays and receiving light rays are guided through the at least one exit window.

4. The optical sensor according to claim 3, the sensor further comprising:

a frame comprised of low-pressure injection molding compound, wherein the at least one exit window is to be positioned inside the frame.

5. The optical sensor according to claim 4, wherein the frame is injection molded onto the outside of the casing by a low-pressure injection molding operation.

6. The optical sensor according to claim 1, wherein the casing body comprises a plurality of substantially planar walls defining an interior volume that encases the sensor assembly unit.

* * * * *